United States Patent
Honda

(10) Patent No.: US 7,088,631 B2
(45) Date of Patent: Aug. 8, 2006

(54) SEMICONDUCTOR STORAGE APPARATUS

(75) Inventor: Yasuhiko Honda, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/019,271

(22) Filed: Dec. 23, 2004

(65) Prior Publication Data
US 2005/0169081 A1 Aug. 4, 2005

(30) Foreign Application Priority Data
Dec. 25, 2003 (JP) ............................. 2003-431029

(51) Int. Cl.
G11C 7/02 (2006.01)
(52) U.S. Cl. .............. 365/210; 365/185.2; 365/185.21; 365/185.25; 365/189.09
(58) Field of Classification Search ........... 365/189.09, 365/185.11, 185.2, 185.21, 185.25, 207, 210
See application file for complete search history.

(56) References Cited

U.S. PATENT DOCUMENTS

| 5,608,676 | A | 3/1997 | Medlock et al. |
| 6,259,645 | B1 * | 7/2001 | Chen et al. ................. 365/210 |
| 6,310,811 | B1 | 10/2001 | Kohno |
| 6,337,825 | B1 * | 1/2002 | Tanzawa et al. ............ 365/207 |
| 6,407,957 | B1 | 6/2002 | Kasa |
| 6,567,350 | B1 * | 5/2003 | Takagi et al. ............ 369/30.23 |
| 6,795,350 | B1 * | 9/2004 | Chen et al. ............ 365/189.07 |

FOREIGN PATENT DOCUMENTS

JP 2001-256789 9/2001

* cited by examiner

Primary Examiner—Tuan T. Nguyen
Assistant Examiner—Toan Le
(74) Attorney, Agent, or Firm—Oblon, Spivak, McClelland, Maier & Neustadt, P.C.

(57) ABSTRACT

A semiconductor storage apparatus includes a cell array including memory cells and reference cells, normal column selection transistors connected to columns of the memory cells, a normal data line array including normal data lines connected to columns of the memory cells, first dummy data lines formed of a same wiring layer of which the normal data lines are formed, a normal data line charging circuit, reference column selection transistors connected to reference columns of the reference cells, a reference data line array including reference data lines formed of a same wiring layer of which the normal data lines are formed, second dummy data lines formed of a same wiring layer of which the reference data lines are formed, a reference data line charging circuit, a first dummy data line charging circuit, a second dummy data line charging circuit, and a sense amplifier which senses data stored in the memory cells.

20 Claims, 6 Drawing Sheets

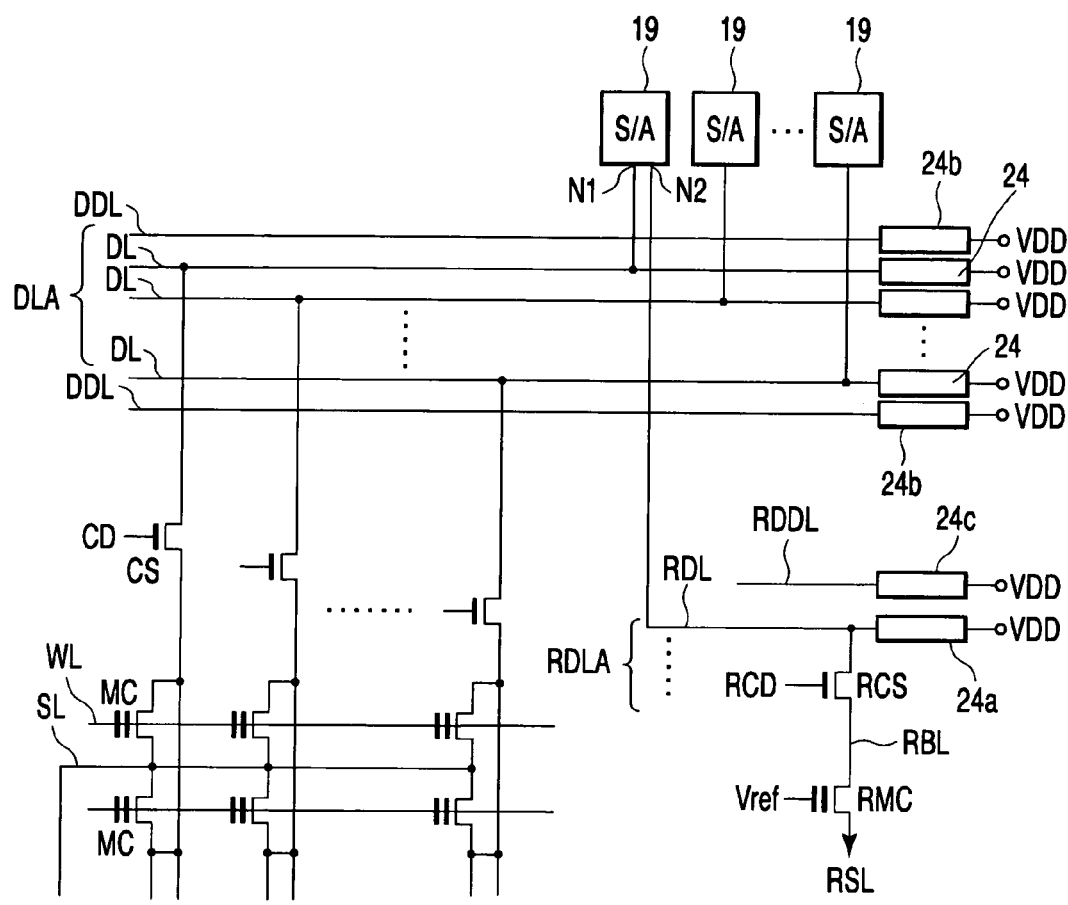
F I G. 2

SEMICONDUCTOR STORAGE APPARATUS

CROSS-REFERENCE TO RELATED APPLICATIONS

This application is based upon and claims the benefit of priority from prior Japanese Patent Application No. 2003-431029, filed Dec. 25, 2003, the entire contents of which are incorporated herein by reference.

BACKGROUND OF THE INVENTION

1. Field of the Invention

The present invention relates to a semiconductor storage apparatus. More particularly, the present invention relates to a data line array and a data line charging circuit in a semiconductor memory which is applied to, for example, a NOR type flash memory.

2. Description of the Related Art

Nonvolatile semiconductor storage apparatuses capable of electrically programmable data include a flash memory capable of electrically erasing data on a number of memory cells. In the flash memory, a charge quantity of a floating gate of a memory cell transistor is changed by an erasing/writing operation, thereby changing a threshold voltage thereof and storing data. For example, "0" data is stored by discharging electrons of the floating gate to set a threshold voltage to be negative, and "1" data is stored by injecting electrons into the floating gate to set the threshold voltage to be positive. The discharge/injection of electrons is carried out between the floating gate and a semiconductor substrate via a tunnel oxide film.

FIG. 9 is a circuit diagram depicting an example of a portion of a cell array, a data line array, a column selector, and a sense amplifier array of a conventional NOR type flash memory.

A sub-cell array (a region provided by dividing a cell array) is formed on a P-type well region which is physically divided in minimum units of erasure. In a memory space of this array, for example, 128K memory cells (cell transistors) MC are allocated in a matrix.

Drains of the cell transistors MC in the same row are connected to bit lines BL, for example, 128 bit lines BL, correspondingly. Drains of the cell transistors MC in the same column are connected to the same bit line BL. Sources of the cell transistors MC in two rows that are adjacent to each other and form one set of row lines in the column direction are connected to the same source line SL.

Word lines WL, for example, 1024 word lines WL, extend in the row direction, and each of the word lines is connected to gates of memory cells MC, for example, 128 memory cells MC, in the corresponding row. Data writing is carried out at the same time and data readout is also carried out at the same time to 128 memory cells MC in the same row, which corresponds to a selected word line.

One end of each of bit lines BL is connected to a sense amplifier S/A via a column select switch CS and a data line DL. A plurality of data lines DL are arranged to form a data line array DLA, and a load circuit (charging circuit) is connected between one end of each of the data lines DL and a power supply (VDD) node. The column select switch CS is formed of an N-channel metal oxide semiconductor field effect transistor (NMOSFET), and a column decode signal CD is inputted from a column decoder to a gate of the transistor so that a column corresponding to the transistor is selected.

In order to reduce interference between data line arrays DLA, a dummy data line DDL is generally provided between the adjacent data line arrays, as shown in FIG. 10. In such a case, in general, the dummy data line DDL is connected to ground. In FIG. 10, VSS denotes a ground potential; Cside denotes a coupling capacitance which exists between the adjacent data lines DL in the data line array; Cside' denotes a coupling capacitance which exists between the data line DL at the outermost side of the data line array and the dummy data line DDL; and Cdown denotes a capacitance which exists between each of the data line DL and the ground.

However, the coupling capacitance Cside' which exists between the data line DL at the outermost side of the data line array and the dummy data line DDL and the coupling capacitance Cside which exists between the adjacent data lines DL in the data line array differs from each other, and thus a capacitance difference exists therebetween. That is, since a potential of the dummy data line DDL adjacent to the data line DL at the outermost side of the data line array is VSS, a coupling capacitance when viewed from the sense amplifier S/A toward the data line side is greater in the case where the data line DL at the outermost side of the data line array is selected in the data read mode than in the case where a data line DL other than that at the outermost side of the data line array is selected in the data read mode. In addition, if the width and thickness of each of the data lines DL in the data line array are different from another one, the coupling capacitance Cside is different according to a combination of the adjacent data lines DL, thus a capacitance difference exists.

When a capacitance difference exists in a coupling capacitance in this way, charge characteristics are different from each other on the basis of the selected data line DL, and a potential rise speed of the data line DL is different from another one. Thus, it has been unavoidable that time is needed until the potential of the data line DL in the data read mode rises close to an equivalent state, after which data determination is made.

On the other hand, when data is read out from a memory cell targeted for readout, a data line DL corresponding to the memory cell and a reference data line (not shown) are selected. However, in order to ensure high speed readout, there is a demand for employing a scheme of sensing data by comparing potentials of the selected data line and reference data line by the sense amplifier S/A in a course of charging the selected data line and reference data line. In this case, as described previously, if charge characteristics are different from each other on a data line basis, there occurs a need for delaying a readout timing according to an electric potential rise of a data line having a large coupling capacitance Cside (data line having a low charge speed), and thus, readout speed is reduced.

As described above, in the conventional NOR type flash memory, there has been a disadvantage that the speed for charging a data line is different from another one depending on a case in which a data line at the outermost side of the data line array is selected in the data read mode and a case where an internal data line of the data line array is selected, and a data readout speed is reduced. In addition, in the case where the width and thickness of each of the data lines in the data line array are not uniform, there has been a disadvantage that a coupling capacitance is different according to a combination of the adjacent data lines in the data line array; a capacitance difference exists; and a data readout speed is reduced. Moreover, discussion relating to a reference data line which is appropriate to read out data contained in the selected data line in the data read mode at a high speed has not been sufficiently made.

A semiconductor integrated circuit described in Jpn. Pat. Appln. KOKAI Publication No. 2001-256789 comprises a memory cell, a plurality of data lines, a sense amplifier, and a dummy data line. The data lines are arranged adjacent to each other and transmit the data read out from the memory cell. The dummy data line is provided along the outside of a data bus line, and a voltage change similar to that of the data line occurs on the dummy data line during a readout operation of the data stored in the memory cell. In the above-described document, there is disclosed that, during the readout operation, due to the similar change of voltage of the dummy data line, an accumulation quantity of a charge for a parasitic capacitance formed between the data line and the dummy data line becomes minimal, and variants in rise time of the plurality of data lines is reduced, so that a readout time (access time) is shortened. However, there is no disclosure relating to a relationship between a data line and a reference data line.

BRIEF SUMMARY OF THE INVENTION

According to an aspect of the present invention, there is provided a semiconductor storage apparatus comprising:

a cell array including a plurality of memory cells and a plurality of reference cells for generating reference potentials, the memory cells and reference cells being arranged in a plurality of rows and columns;

a plurality of normal column selection transistors connected to a plurality of columns of the memory cells of the cell array, respectively, and driven by a first decode signal to select a column;

a normal data line array including a plurality of normal data lines, the plurality of normal data lines being arranged at a predetermined interval from one another, and connected correspondingly to the plurality of columns of the cell array via the column selection transistors;

first dummy data lines formed of a same wiring layer of which the normal data lines of the normal data line array are formed, the first dummy data lines being provided at the outsides of the normal data line array along the normal data lines and being spaced from outermost data lines of the data line array at an interval which is equal to that between the normal data lines, and the first dummy data lines having same thickness, length, and width as the normal data lines of the normal data line array;

a normal data line charging circuit which charges a normal data line selected corresponding to a memory cell targeted for readout in a data read mode;

a plurality of reference column selection transistors connected correspondingly to a plurality of reference columns of the reference cells of the cell array, and driven by a second decode signal to select a reference column;

a reference data line array including a plurality of reference data lines, the plurality of reference data lines being arranged at a predetermined interval from one another, and connected correspondingly to the plurality of reference columns of the cell array via the reference column selection transistors, the plurality of reference data lines being formed of a same wiring layer of which the normal data lines of the normal data line array are formed, and the plurality of reference data lines having same thickness, length, and width as the normal data lines of the normal data line array;

second dummy data lines formed of a same wiring layer of which the reference data lines of the reference data line array are formed, the second dummy data line being provided at the outsides of the reference data line array along the reference data lines and being spaced from outermost reference data lines of the reference data line array at an interval which is equal to that between the reference data lines, and the second dummy data line having same thickness, length, and width as the reference data lines of the reference data line array;

a reference data line charging circuit which charges a reference data line selected corresponding to a reference cell targeted for readout in the data read mode;

a first dummy data line charging circuit which charges the first dummy data lines provided at the outsides of the normal data line array to which a selected normal data line belongs in the data read mode;

a second dummy data line charging circuit which charges the second dummy data lines provided at the outsides of the reference data line array to which a selected reference data line belongs in the data read mode; and a sense amplifier which senses data stored in the memory cell targeted for readout, by comparing potentials on the selected normal data line and the selected reference data line in the course of charging the selected data line and the selected reference data line.

According to another aspect of the present invention, there is provided a semiconductor storage apparatus according to claim 1, wherein the cell array comprises a plurality of memory banks, and an access is made to a memory bank to erase or write data to the memory bank during a read operation for another memory bank, a current copy circuit copies a reference cell current of a reference cell used as a reference in common in the plurality of memory banks to each of the memory banks, a plurality of mirror transistor circuits are provided corresponding to the plurality of memory banks, each of the plurality of mirror transistor circuits comprising a plurality of mirror transistors connected to a plurality of reference bit lines of a corresponding memory bank and supplying the reference cell current copied by the copy circuit to the plurality of reference bit lines of the corresponding memory bank, and a distance of a wiring extending from the sense amplifier to the normal data line charging circuit is substantially equal to that of a wiring extending from the sense amplifier to the plurality of memory cells of each of the plurality of memory banks, to make charge speeds in the course of charge of the normal data lines and the reference data lines substantially equal to each other.

BRIEF DESCRIPTION OF THE SEVERAL VIEWS OF THE DRAWING

FIG. 2 is a circuit diagram depicting a portion of a cell array, a column selector, a data line array, and a sense amplifier in FIG. 1;

DETAILED DESCRIPTION OF THE INVENTION

FIRST EMBODIMENT

Figure 1:
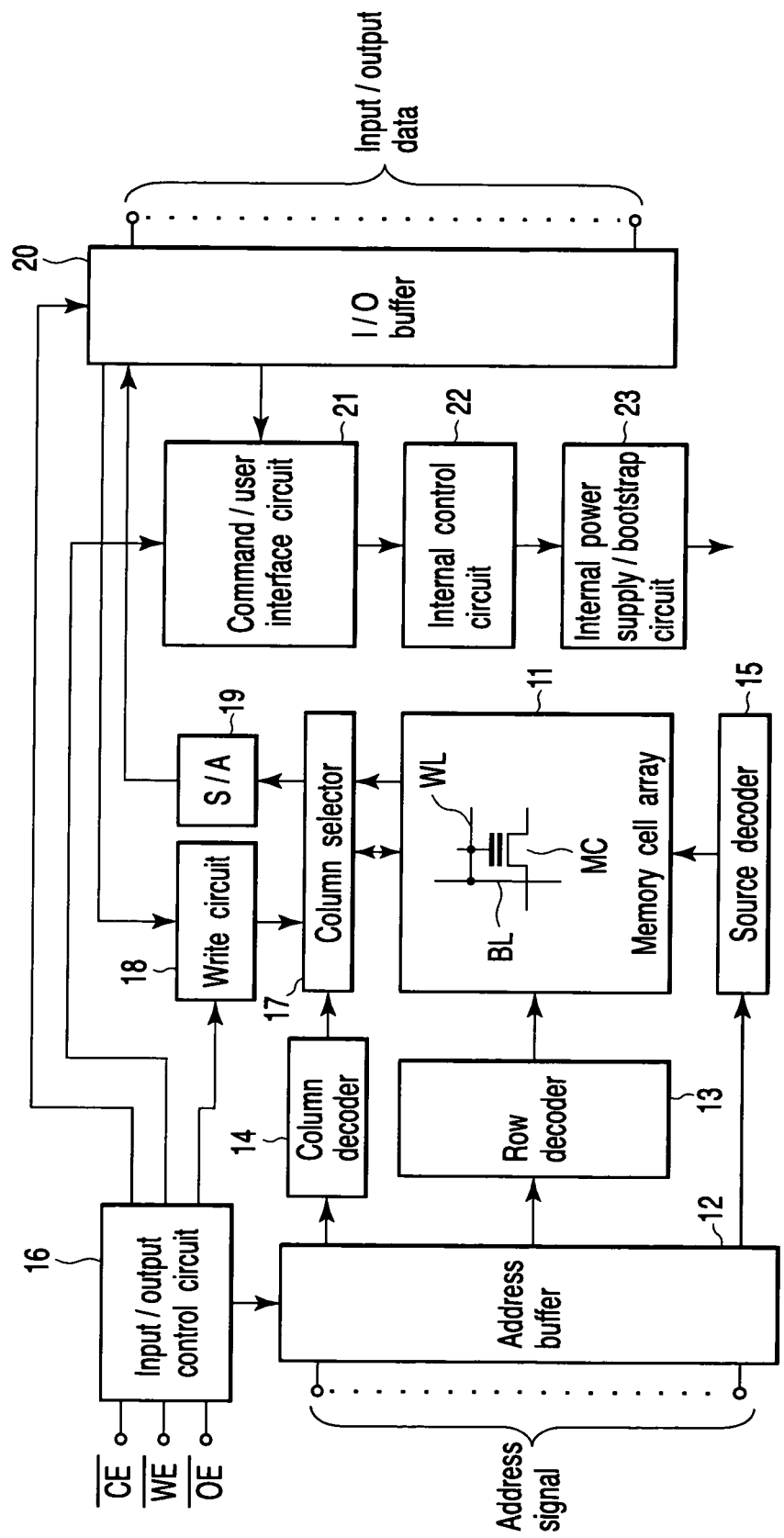
FIG. 1 is a block diagram schematically depicting a configuration of a chip inside of a NOR type flash memory according to a first embodiment of the present invention.

FIG. 1 is a block diagram depicting a configuration of a chip inside of a NOR type flash memory according to a first embodiment of the present invention.

In FIG. 1, in a cell array 11, a plurality of memory cells (flash cells) MC are arranged in a matrix, and a plurality of bit lines BL and word lines WL are formed. Typically, one memory cell, one bit line BL, and one word line WL are illustrated therein.

Each cell transistor MC has a floating gate, a control gate, a source, and a drain. Data programming (data writing) is carried out by changing a threshold value viewed from the control gate by injecting electrons into the floating gate, and data erasure is carried out by removing electrons from the floating gate.

An address buffer 12 generates an internal address signal upon the receipt of an external address signal. The internal address signal generated by the address buffer 12 is supplied to a row decoder (word line selector drive circuit) 13, a column decoder 14, and a source decoder 15.

An input/output control circuit 16 receives a chip enable signal /CE, a write enable signal /WE, and an output enable signal /OE, which are externally inputted, and generates a variety of control signals for controlling operation of internal circuits based on these input signals. For example, the control signal based on the chip enable signal /CE is supplied to the address buffer 12. In the address buffer 12, an operation for generating the internal address signal is controlled based on this control signal. The control signal based on the output enable signal /OE is supplied to a I/O buffer described later. In the I/O buffer, an operation of outputting data is controlled based on this control signal. The control signal based on the write enable signal /WE is supplied to a write circuit 18 described later. In the write circuit 18, a data write operation is controlled based on this control signal.

The row decoder 13 selects the word line WL in the cell array 11 based on the internal address signal (internal row address signal) outputted from the address buffer 12. The column selector 17 selects a bit line BL in the cell array 11 based on a decode output from the column decoder 14.

The source decoder 15 selects a source line in the cell array 11 based on the internal address signal outputted from the address buffer 12, and a predetermined voltage is supplied to the selected source line.

The write circuit 18 supplies write data to the selected memory cell in the cell array 11 in the data write to writes data.

A sense amplifier (S/A) 19 collectively shows a sense amplifier array in which a number of sense amplifiers 19 are arranged, and senses and amplifies the readout data from the selected memory cell in the cell array 11 in the data read mode.

An I/O buffer 20 supplies the externally supplied data to the write circuit 18 in the data write, and outputs the sensed and amplified data by the S/A 19 to an external circuit in the data read mode. In addition, to this buffer 20, command data is supplied for setting each of operating modes, namely, data write, erasure, and readout operating modes.

A command/user interface circuit 21 receives a control signal outputted from the input/output control circuit 16, and receives command data inputted from the I/O buffer 20 at a timing when the write enable signal /WE is activated.

An internal control circuit 22 generates an internal control signal according to the command data supplied from the I/O buffer 20 via the command/user interface circuit 21. An internal power supply/boosting circuit 23 is controlled by the internal control signal outputted from the internal control circuit 22 and generates a high voltage at a positive polarity or at a negative polarity from the power supply voltage externally applied. The high voltage is used as an internal power voltage. The high voltage generated by the internal power supply/boosting circuit 23 is supplied to circuits in the semiconductor chip.

FIG. 2 shows a portion of the cell array, column selector, data line array, and sense amplifier array in FIG. 1.

In FIG. 2, each of the drains of a plurality of cell transistors MC of the same column in a cell array is connected in common to the bit line BL; each of the control gates of a plurality of cell transistors MC in the same row is connected in common to the word line; and the source of each cell transistor MC is connected to a common source line SL in units of blocks of the cell array.

MOS transistors CS (for example, 128 transistors) for a plurality of column selections are provided in the column selector 17 in FIG. 1 corresponding to a plurality of bit lines BL (128 lines). In addition, a plurality of data lines DL (128 lines) and a plurality of sense amplifiers S/A 19 (128 sense amplifiers) are provided corresponding to the column selecting MOS transistor CS. One of the column selecting MOS transistors CS is selected by a first decode signal CD, whereby one bit line BL is selected, and the selected bit line BL is connected to a corresponding sense amplifier S/A 19 via the corresponding data line DL. In the case where data in plurality of bits is processed at the same time, one bit line BL is selected at the same time in each of a plurality of cell blocks, and each of these selected bit lines is connected to the corresponding sense amplifier S/A 19 via the corresponding data line DL at the same time.

A plurality of normal data lines DL are arranged in parallel to each other so as to have a predetermined interval between the adjacent data lines, and the plurality of data lines DL form a data line array DLA. The plurality of data lines DL are formed by processing the same wiring layer and have the same configuration, namely, the same thickness, the same length, and the same width.

A first dummy data line DDL is provided at the each outside of the data line array in the arrangement direction of the data lines DL of the data line array, along the data line DL at the outermost side of the data line array DLA. The first dummy data lines DDL is spaced apart, at an interval equal to that between the data lines DL of the data line array DLA, from the outermost data line DL of the data line array DLA. The first dummy data line DDL and the data lines DL of the data line array DLA are formed by processing the same wiring layer. The first dummy data line DDL has the same configuration as each of the data lines DL. That is, the first dummy data line DDL has the same thickness, the same length, and the same width as the data lines DL.

Figure 3:
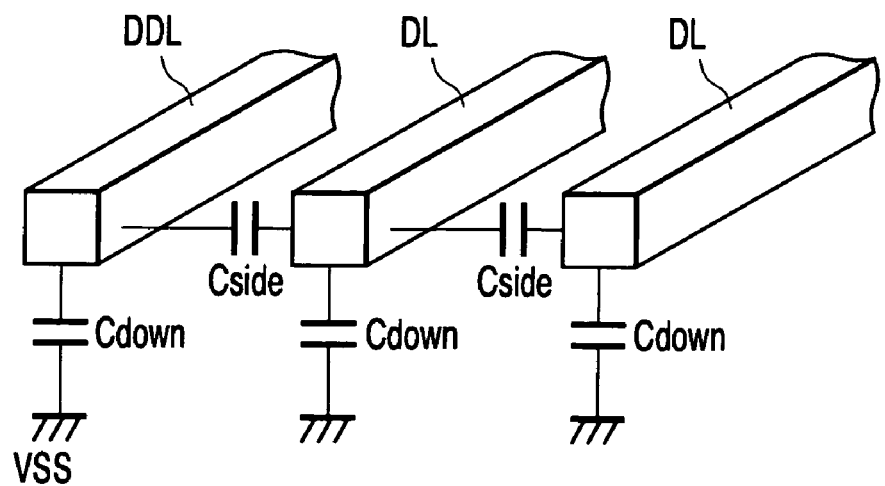
FIG. 3 is a perspective view showing a portion of a data line array and a first dummy data line in FIG. 2.

FIG. 3 is a perspective view showing a portion of the data line array DLA and first dummy data line DDL in FIG. 2.

The plurality of data lines DL and the first dummy data lines DDL are formed by processing the same wiring layer and have the same configuration, namely, the same thickness, the same length, and the same width. Also, the plurality of data lines DL and the first dummy data lines DDL are arranged in parallel to each other so as to have a predetermined interval between the adjacent data lines. Accordingly, the coupling capacitance Cside which exists between the data line DL at the outermost side of the data line array and the first dummy data line DDL and the coupling capacitance Cside which exists between the adjacent data lines DL in the data line array are equal to each other. Also, the capacitance (Cdown) between each of the data lines DL and the ground and the capacitance (Cdown) between the first dummy data line DDL and the ground are equal to each other.

Data line charging circuit 24 for charging the data lines DL are connected between one ends of the data lines DL and the power supply nodes VDD, as shown in FIG. 2. Similarly, dummy data line charging circuit 24b for charging the dummy data lines DDL are connected between one ends of the dummy data lines DDL and the power supply nodes VDD, as shown in FIG. 2. The data line charging circuit 24 and the dummy data line charging circuit 24b have the same configuration and the same characteristics.

Figure 4:
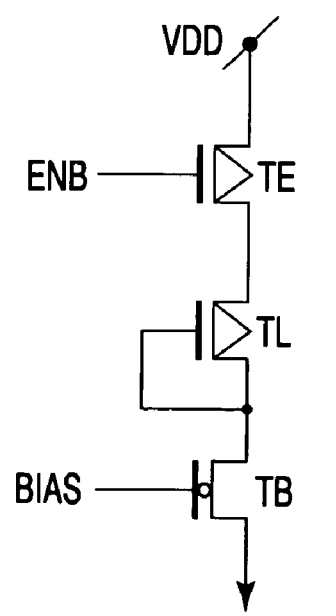
FIG. 4 is a circuit diagram depicting an example of a data line charging circuit in FIG. 2.

FIG. 4 is a circuit diagram depicting an example of one data line charging circuit 24 in FIG. 2.

In the data line charging circuit 24, between a power supply (VDD) node and a data line DL, there are connected in series a PMOS transistor TE selectively driven by a third decode signal ENB, a PMOS transistor TL for data line loading, and an NMOS transistor TB for data line electric potential clamping, to the gate of which a bias voltage BIAS is applied. Each of the dummy data line charging circuits 24b also has the same configuration and characteristics as the data line charging circuits 24. In the case of the data line charging circuits 24b, a source of the NMOS transistor TB for data line electric potential clamping is connected to the dummy data line DDL, as shown in FIG. 4.

With the circuit structure as described above, the data line DL selected in the data read mode and the first dummy data line DDL are charged at an equal speed by the data line charging circuits 24 and the dummy data line charging circuits 24b, respectively. Accordingly, the coupling capacitance Cside' which exists between the data line DL at the outermost side of the data line array DLA and the dummy data line DDL and the coupling capacitance Cside which exists between the adjacent data lines DL in the data line array DLA are substantially equal to each other.

Each of the sense amplifiers S/A 19 in FIG. 2 is composed of a differential amplifier, for example. To a pair of sense nodes N1, N2 thereof, there is inputted an electric potential of the data line DL selected by the MOS transistor CS for column selection at the memory cell side and an electric potential of a reference data line RDL selected by an MOS transistor RCS for reference column selection at the side of reference electric potential generation.

The circuit construction at the reference cell side is similar to that at the memory cell side. That is, the circuit structure at the reference cell side comprises a plurality of reference cell transistors, a plurality of reference bit lines, a plurality of reference column selection MOS transistors, a plurality of reference data lines forming a reference data line array RDLA, a second dummy data line provided at each outside of the reference data line array RDLA, and a second dummy data line charging circuit. FIG. 2 shows a typical example of each of a reference cell transistor RMC, a reference bit line RBL, an MOS transistor RCS for reference column selection selectively driven by a second decode signal RCD, a reference data line RDL in a reference data line array RDLA, a second dummy data line RDDL, a reference data line charging circuit 24a, and a second dummy data line charging circuit 24c.

The plurality of reference data lines RDL are arranged in parallel to each other so as to have a predetermined interval between the adjacent data lines, which predetermined interval is equal to the predetermined interval of the plurality of data lines DL. The plurality of reference data lines RDL forms a reference data line array RDLA. The plurality of reference data lines RDL are formed by processing the same wiring layer and have the same configuration, namely, the same thickness, the same length, and the same width.

The second dummy data line RDDL is provided at the outside of the reference data line array RDLA in the arrangement direction of the reference data lines RDL of the reference data line array RDLA, along the reference data line RDL at the outermost side of the reference data line array RDLA. The second dummy data lines RDDL is spaced apart, at an interval equal to that between the reference data lines RDL of the reference data line array RDLA, from the outermost reference data line RDL of the reference data line array RDLA. The second dummy data line RDDL and the reference data lines RDL of the reference data line array RDLA are formed by processing the same wiring layer. The second dummy data line RDDL has the same configuration as each of the reference data lines RDL. That is, the second dummy data line RDDL has the same thickness, the same length, and the same width as the reference data lines RDL.

Furthermore, the reference data line array RDLA and the data line array DLA are formed by processing the same wiring layer. Specifically, the reference data lines RDL of the reference data line array RDLA and the data lines DL of the data line array DLA are formed by processing the same wiring layer. Therefore, the data lines DL, the first dummy data line DDL, the reference data lines RDL, and the second dummy data line RDDL are formed by processing the same wiring layer, and have the same thickness, the same length, and the same width to one another.

As shown in FIG. 2, in the reference cell transistor RMC, a drain is connected to the reference bit line RBL, a control gate is connected to a node of a readout electric potential Vref, and a source is connected to a reference source line RSL. In addition, the reference data line charging circuit 24a and the second dummy data line charging circuit 24c have the same configuration and the same characteristics as the data line charging circuit 24 shown in FIG. 4. The reference data line charging circuit 24a is connected between a VDD node and one end of the reference data line RDL, and the second dummy data line charging circuit 24c is connected between a VDD node and one end of the second dummy data line RDDL. The reference data line charging circuit 24a and the second dummy data line charging circuit 24c charge the reference data line RDL and the second dummy data line RDDL selected in the data read mode, respectively.

With the circuit structure as described above, the reference data line RDL selected in the data read mode and the second dummy data line RDDL are charged at an equal speed by the reference data line charging circuits 24a and the second dummy data line charging circuits 24c, respectively. Accordingly, the coupling capacitance which exists between the reference data line RDL at the outermost side of the reference data line array RDLA and the second dummy data line RDDL and the coupling capacitance which exists between the adjacent reference data lines RDL in the reference data line array RDLA are substantially equal to each other.

A data line DL of a non-selected portion may be used as a reference data line RDL by connecting the data line to a reference cell without being provided as a specific reference data line RDL.

Next, a data readout operation in the NOR type flash memory of FIG. 1 will be described here. In the data read mode, one of a plurality of word lines WL is selected and driven by a decode output of an address signal inputted from outside of the chip (i.e., an output of the row decoder 13, an output of the column decoder 14, and an output of the source decoder 15). In addition, a column selection transistor and a reference column selection transistor are selectively driven, whereby a cell transistor MC and a reference cell RMC are selected.

In the case where the storage data in the selected cell transistor MS is "0" (in a write state, i.e., in a state in which a threshold value is high), only a current which is equal to or lower than an allowable value of a leak current flows in a bit line BL to which this selected cell transistor MC is connected. In contrast, in the case where the storage data in the selected cell transistor MC is "1" (in an erased state or in a state in which writing is not carried out and a threshold voltage is low), the selected cell transistor MC is turned ON, and a cell current flows in the bit line BL to which the selected cell transistor MC is connected. Therefore, a different electric potential according to the storage data "0" or "1" of the cell transistor MC in the selected state is inputted to a first cell node N1 of the sense amplifier S/A 19.

In contrast, at the reference cell side, a reference data line RDL is charged based on the current which flows to the selected reference cell RMC, and a predetermined reference electric potential is inputted to a second sense node N2 of the sense amplifier S/A 19.

Figure 5:
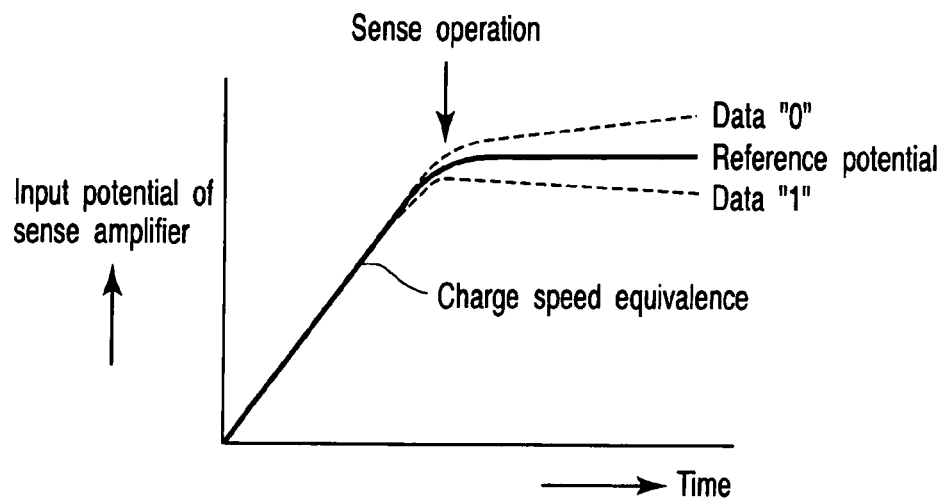
FIG. 5 is a characteristic view showing an appearance of an electric potential rise of two sense nodes in a sense amplifier caused by a current according to storage data on a cell transistor selected during a data read mode operation of the NOR type flash memory and a current of a selected reference cell.

FIG. 5 is a characteristic view showing an example (electric potential waveform) of an electric potential rise in two sense nodes of a sense amplifier caused by a current according to the storage data in the selected cell transistor and a current of the selected reference cell in the data readout operation of the NOR type flash memory of FIG. 1.

The data line DL communicating with the sense node N1 and the reference data line RDL communicating with the sense node N2 (FIG. 2) are formed of the same wiring layer and has the same configuration. Further, these data lines DL and RDL are charged by the charging circuits 24 and 24a having the same characteristics, respectively, and thus, the charge speeds in the course of charging of these data lines DL and RDL are substantially equal to each other.

The sense amplifier S/A 19 outputs a level "H" or "L" as determination data by comparing the electric potentials of two sense nodes N1, N2. In the data read mode, the selected column selection transistor CS and reference column selection transistor RCS are driven at the same timing. The data line DL and reference data line RDL corresponding to these selected column selection transistor CS and reference column selection transistor RCS are charged at the same speed by the corresponding charging circuits 24 and 24a, respectively. Therefore, it is possible to speed up a readout operation.

In this case, a data line selection transistor TE of each of the corresponding charging circuits 24b, 24c is driven at the same timing as the data line transistor TE of each of the charging circuit 24, 24a by a decode signal ENB, whereby the first dummy data line DDL and the second dummy data line RDDL are charged at the same speed as the data line DL and reference data line RDL.

As described previously, a coupling capacitance between the data line DL at the outermost side of the data line array DLA and the adjacent data line DL and a coupling capacitance between the adjacent data lines DL in the data line array DLA are equal to each other, thus making it possible to minimize an interval between the data lines DL in the data line array DLA. In the NOR type flash memory having a large area of the data line array DLA, the reduction effect on the data line array DLA region is significant, thus the semiconductor chip size can be reduced.

In the data read mode, the initial value of each of the electric potentials of the selected data line, reference data line, and first dummy data line, and second dummy data line is set to ground potential by turning ON a power charging transistor, for example, to make the charge characteristics of these data lines uniform, thereby improving readout characteristics.

SECNOD EMBODIMENT

In the NOR type flash memory according to a second embodiment of the present invention, an RWW (Read While Write) scheme is applied such that the NOR type flash memory shown in the first embodiment has a plurality of memory banks, and an access can be carried out so as to make an erase/write operation for another memory bank while in a readout operation for a certain memory bank. Further, in order to control variations between a reference cell current for a readout bank and a reference cell current for a write/erase bank, an IREF scheme is employed to generate a reference cell current for a readout bank and a reference cell current for a write/erase bank from a specific reference cell current by using a current mirror circuit. Each of a mirror transistor circuits for supplying the reference cell current is arranged such that a wiring distance from the sense amplifier to a plurality of mirror transistors of a mirror transistor circuit is substantially equal to a wiring distance from the sense amplifier to the memory cells of the plurality of memory banks, whereby the charge speed in the course of charging to the normal data line DL and the reference data line RDL is substantially equal to each other. Alternatively, a wiring distance from the data line charging circuit to a plurality of mirror transistors of a mirror transistor circuit is substantially equal to a wiring distance from the data line charging circuit to the memory cells of the plurality of memory banks, whereby the charge speed in the course of charging to the normal data line DL and the reference data line RDL is substantially equal to each other.

Figure 6:
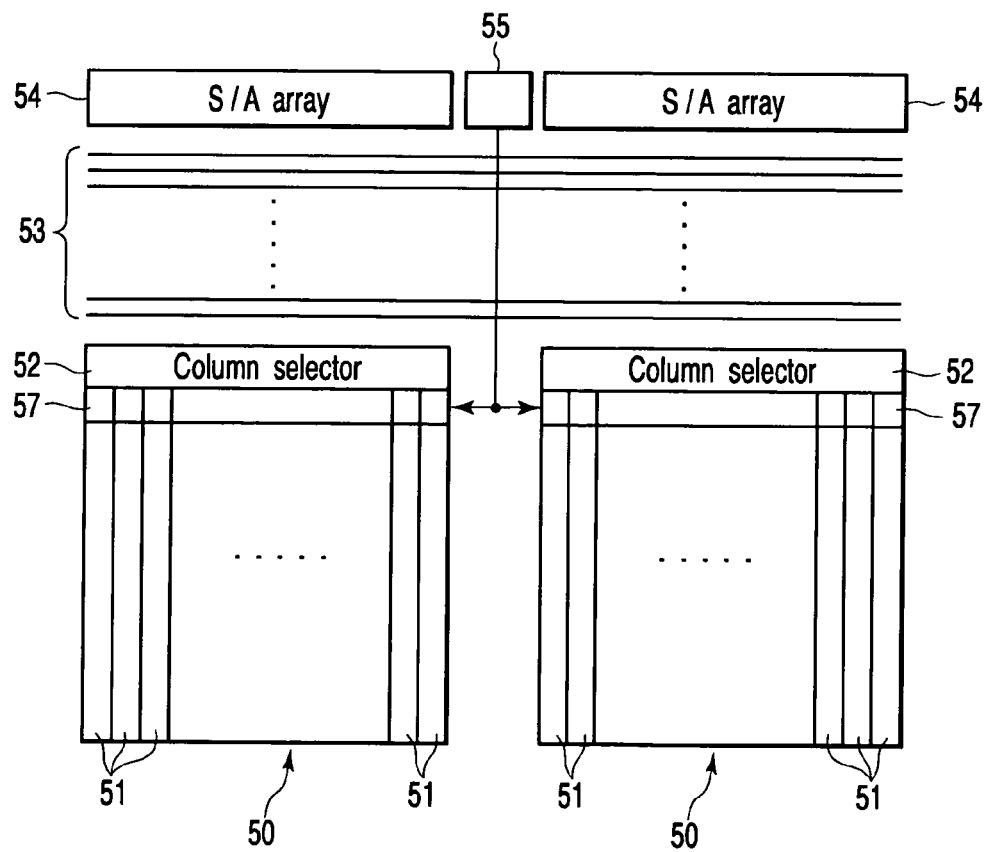
FIG. 6 is a block diagram depicting a configuration of a chip inside of an NOR type flash memory according to a second embodiment of the present invention to which an RWW scheme and an IREF scheme are applied.

FIG. 6 is a block diagram depicting a configuration of a chip inside of an NOR type flash memory to which the RWW scheme according to the second embodiment of the present invention is applied.

In this NOR type flash memory, a cell array is divided into, for example, two cell arrays 50, and each of the cell arrays 50 is divided into a plurality of memory banks 51. Each of the cell arrays 50 is connected to a sense amplifier S/A array 54 via a column selector 52 and a data line array 53. Here, a reference data line array, a data line charging circuit and the like are not illustrated.

In a region between the two cell arrays 50, there is provided a current copy current 55 for copying to each memory bank a reference cell current of a reference cell used as a reference in common in the plurality of memory banks 51.

A plurality of mirror transistor circuits 57 for supplying the reference cell current copied by the current copy circuit 55 to a plurality of reference bit lines of each of the plurality of memory banks 51 are arranged in a region in front of (at the memory cell side) of the plurality of column selectors 52 corresponding to the plurality of memory banks 51. In this structure, when each of a mirror transistor circuits for supplying the reference cell current is configured such that a wiring distance from the sense amplifier to a plurality of mirror transistors of a mirror transistor circuit is substantially equal to a wiring distance from the sense amplifier to the memory cells of the plurality of memory banks, the charge speed in the course of charging to the normal data line DL and the reference data line RDL is substantially equal to each other. Alternatively, when a wiring distance from the data line charging circuit to a plurality of mirror transistors of a mirror transistor circuit is substantially equal to a wiring distance from the data line charging circuits to the memory cells of the plurality of memory banks, the charge speed in the course of charging to the normal data line DL and the reference data line RDL is substantially equal to each other.

Figure 7:
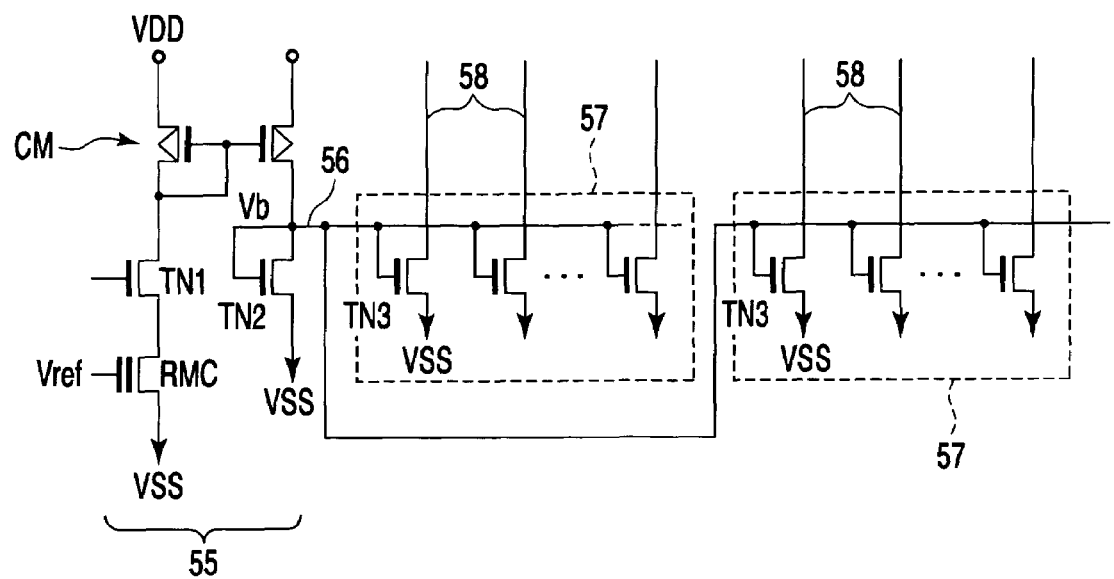
FIG. 7 is a circuit diagram depicting a specific example of a current copy circuit in FIG. 6 and a portion of a mirror transistor circuit in FIG. 6 for copying a reference cell current to each reference data line for each memory bank.

FIG. 7 is a circuit diagram depicting a specific example of a current copy circuit in FIG. 6 and a portion of a mirror transistor circuit in FIG. 6 for copying a reference cell current to each reference data line for each memory bank 51.

In the current copy circuit 55, a cell current of a reference cell RMC is inputted to a PMOS current mirror circuit CM via an NMOS transistor TN1 for reference selection. The PMOS current mirror circuit CM makes a flow of current equal to a cell current to an NMOS transistor TN2 to which a drain and a gate are interconnected. A bias voltage Vb generated by the NMOS transistor TN2 is outputted to a bias wiring 56.

The bias voltage Vb supplied from the bias wire 56 is applied to a gate of each of the NMOS mirror transistors TN3 of each of the mirror transistor circuits 57. In this manner, a reference cell current is supplied to a reference data line (not shown) via a reference bit line 58 and the selected reference column selection transistor (not shown) connected to the corresponding NMOS mirror transistors TN3.

In this structure, when each of a mirror transistor circuits 57 for supplying the reference cell current is configured such that a wiring distance from a sense amplifier of an S/A array denoted by 54 (FIG. 6) to memory cells (memory cell transistors, not shown) of the plurality of memory banks 51 is substantially equal to a wiring distance from the sense amplifier of the S/A array 54 to the mirror transistors TN3, the charge speed in the course of charging a data line and a reference data line is substantially equal to each other.

Alternatively, when each of a mirror transistor circuits 57 for supplying the reference cell current is provided such that a wiring distance from a plurality of data line charging circuits to memory cells (memory cell transistors, not shown) of the plurality of memory banks 51 is substantially equal to a wiring distance from the plurality of data line charging circuits to the mirror transistors TN3, the charge speed in the course of charging a data line and a reference data line is substantially equal to each other.

Although not shown in FIG. 7, a plurality of transistors for mirror transistor selection selectively controlled to an ON state by a bank decode signal may be provided to supply the bias voltage Vb by selecting a memory bank targeted for selection.

THIRD EMBODIMENT

As in the NOR type flash memory according to the second embodiment, when the plurality of mirror transistor circuits 57 to which a current is copied by the current copy circuit 55 are provided, the parasitic capacitance for the current copy circuit 55 increases. Then, a redundant time interval from when a mirror current begins to flow in the mirror transistor circuits 57 to when an operation is stabilized is required. Thus, as long as a readout start time is delayed according to such redundant time interval, data judgment cannot be precisely attained.

Further, as in the NOR type flash memory according to the second embodiment, when the bias wiring 56 for supplying the bias voltage Vb for mirror current copy from the current copy circuit 55 to the mirror transistor circuits 57 of each of the memory banks 51 is formed, a noise is generated due to a coupling with another signal line to which the bias wire 56 is adjacent.

In a NOR type flash memory according to a third embodiment of the present invention, in order to read data at high speed, a time interval from when a mirror current begins to flow in the mirror transistor TN3 to when an operation is stabilized is shortened, and further, the generation of a noise due to the presence of the bias wire 56 is prevented.

Figure 8:
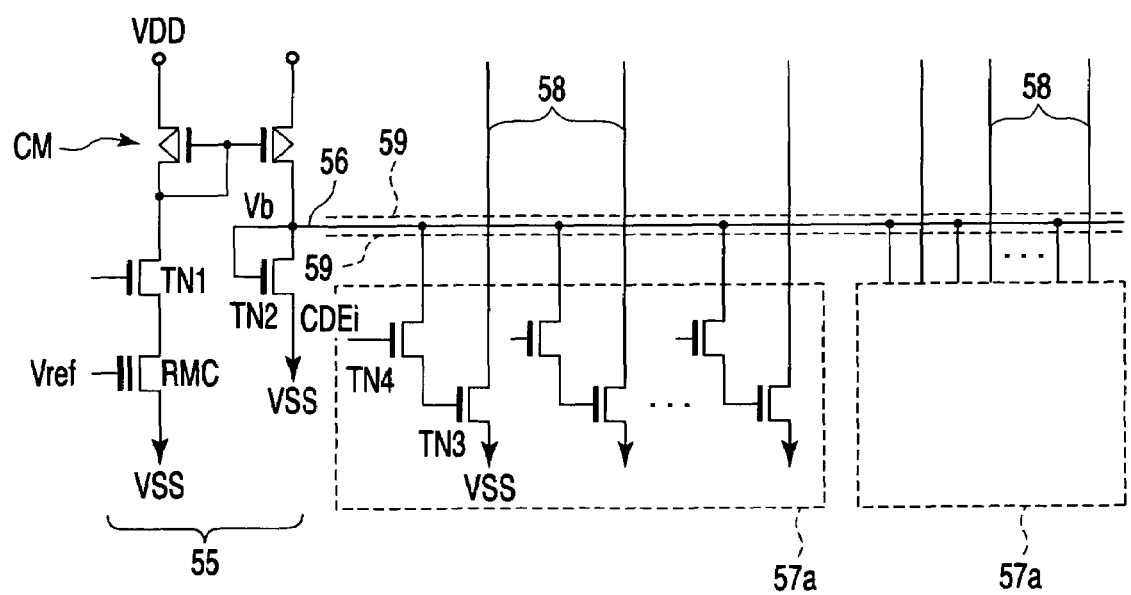
FIG. 8 is a circuit diagram depicting a specific example of a current copy circuit in FIG. 6 and a portion of a mirror transistor circuit in FIG. 6 for copying a reference cell current to each reference data line for each memory bank in the case of a NOR type flash memory according to a third embodiment of the present invention to which an RWW scheme and an IREF scheme are applied.
Figure 9:
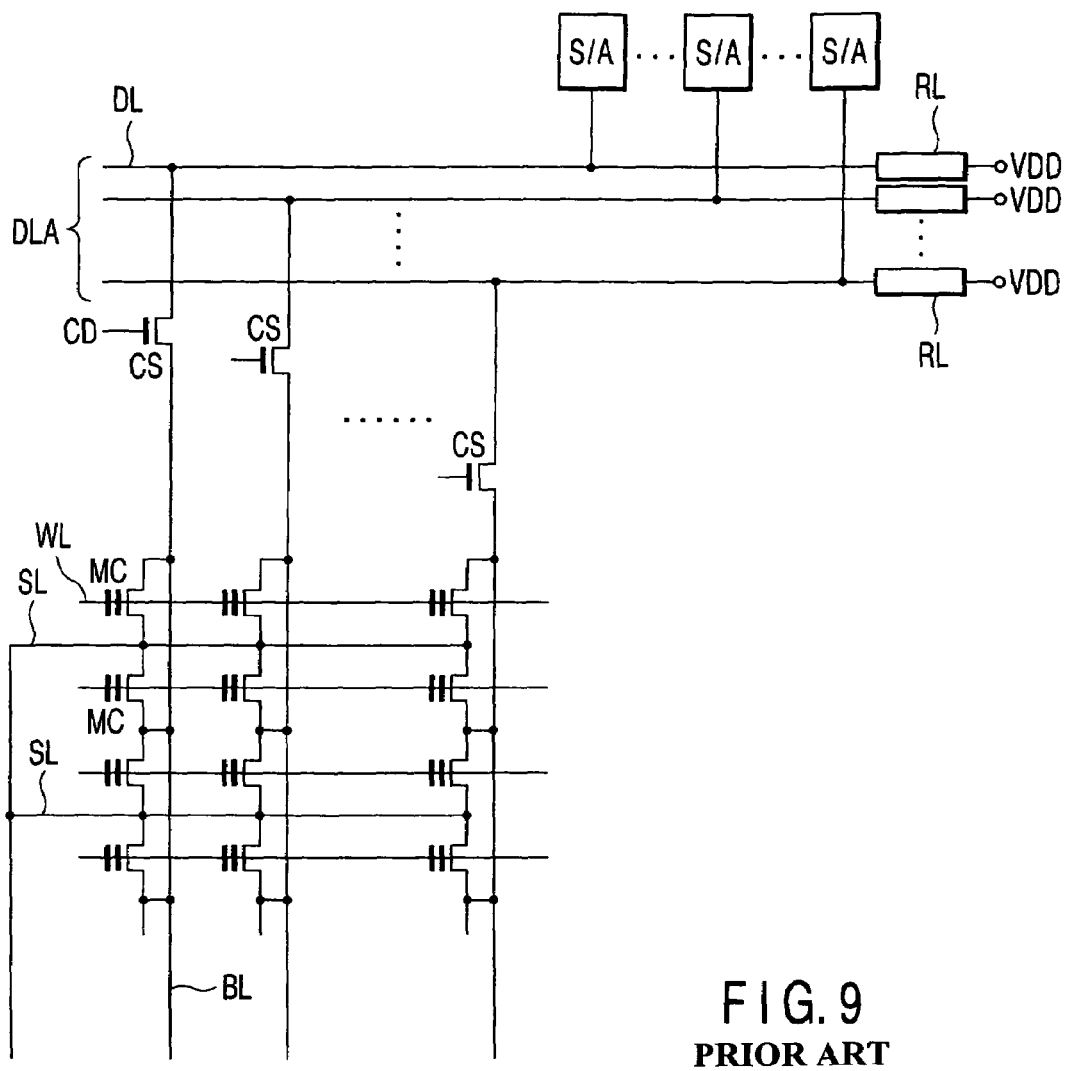
FIG. 9 is circuit diagram depicting a portion of a cell array, a column selector, a data line array, and a sense amplifier array of a conventional NOR type flash memory.
Figure 10:
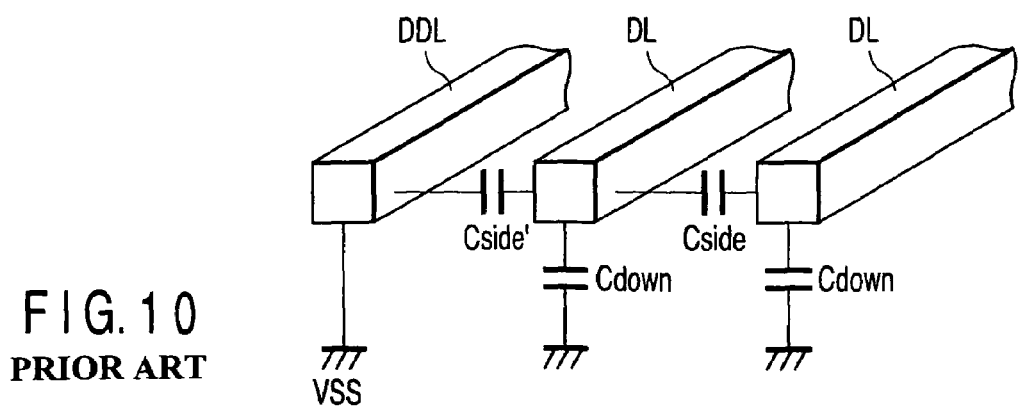
FIG. 10 is a perspective view showing a portion of the data line array in the conventional NOR type flash memory.

FIG. 8 shows another specific example of the current circuit 55 and mirror transistor circuits 57 in FIG. 6.

This circuit is different from the circuit shown in FIG. 7 as follows. That is, in order to select the mirror transistor TN3 connected correspondingly to the reference bit line 58, a mirror transistor selection transistor TN4 selectively driven by a fourth decode signal CDEi is connected to the gate input of each mirror transistor TN3, a shield wire 59 is laid out along both sides of the bias wiring 56, and the shield wiring 59 is connected to a fixed potential (for example, ground potential). The other elements are the same as in those in FIG. 7, and thus, like elements are designated by like reference numerals in FIG. 7.

With such a configuration, it is possible to select only that of the plurality of mirror transistors TN3 of each of the mirror transistor circuits 57, which is used, by the mirror transistor selection transistors TN4. In this manner, a time interval from when a mirror current begins to flow in the mirror transistor TN3 to when an operation is stabilized is shortened, thus enabling high speed readout.

It is desirable that a timing of the fourth decode signal CDEi for selectively driving the mirror transistor selection transistor TN4 is made coincident with a timing of a word line drive signal for selectively driving a word line (not shown) for memory cell selection or a timing of the second decode signal RCD for selecting and driving the reference column selection transistor RCS. In order to make these timings coincident with each other, the decode operations of the decoder circuits for generating the decode signal may be controlled by using an address decoder enable signal. The address decoder enable signal is activated in synchronism with a rear edge of an address change detecting pulse signal (not shown) generated when a change of an address input is detected by an address change detector circuit (not shown).

In addition, in the present embodiment, an influence by noises on the bias wiring 56 arranged along both sides of the bias wiring 56 is reduced by connecting the shield wiring 59 to the fixed potential.

According to the embodiments of the present invention, charge speeds for the selected data lines and reference data lines in the course of charge can be made substantially equal to each other, hence a readout speed can be increased by comparing the potentials of the data lines and reference data lines in the course of charging the data lines and reference data lines.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor storage apparatus comprising:
    a cell array including a plurality of memory cells and a plurality of reference cells for generating reference potentials, the memory cells and reference cells being arranged in a plurality of rows and columns;
    a plurality of normal column selection transistors connected to a plurality of columns of the memory cells of the cell array, respectively, and driven by a first decode signal to select a column;
    a normal data line array including a plurality of normal data lines, the plurality of normal data lines being arranged at a predetermined interval from one another, and connected correspondingly to the plurality of columns of the cell array via the column selection transistors;
    first dummy data lines formed of a same wiring layer of which the normal data lines of the normal data line array are formed, the first dummy data lines being provided at the outsides of the normal data line array along the normal data lines and being spaced from outermost data lines of the data line array at an interval which is equal to that between the normal data lines, and the first dummy data lines having same thickness, length, and width as the normal data lines of the normal data line array;
    a normal data line charging circuit which charges a normal data line selected corresponding to a memory cell targeted for readout in a data read mode;
    a plurality of reference column selection transistors connected correspondingly to a plurality of reference columns of the reference cells of the cell array, and driven by a second decode signal to select a reference column;
    a reference data line array including a plurality of reference data lines, the plurality of reference data lines being arranged at a predetermined interval from one another, and connected correspondingly to the plurality of reference columns of the cell array via the reference column selection transistors, the plurality of reference data lines being formed of a same wiring layer of which the normal data lines of the normal data line array are formed, and the plurality of reference data lines having same thickness, length, and width as the normal data lines of the normal data line array;
    second dummy data lines formed of a same wiring layer of which the reference data lines of the reference data line array are formed, the second dummy data line being provided at the outsides of the reference data line array along the reference data lines and being spaced from outermost reference data lines of the reference data line array at an interval which is equal to that between the reference data lines, and the second dummy data line having same thickness, length, and width as the reference data lines of the reference data line array;
    a reference data line charging circuit which charges a reference data line selected corresponding to a reference cell targeted for readout in the data read mode;
    a first dummy data line charging circuit which charges the first dummy data lines provided at the outsides of the normal data line array to which a selected normal data line belongs in the data read mode;
    a second dummy data line charging circuit which charges the second dummy data lines provided at the outsides of the reference data line array to which a selected reference data line belongs in the data read mode; and
    a sense amplifier which senses data stored in the memory cell targeted for readout, by comparing potentials on the selected normal data line and the selected reference data line in the course of charging the selected data line and the selected reference data line.

2. A semiconductor storage apparatus according to claim 1, wherein the first decode signal and second decode signal are supplied at a same timing.

3. A semiconductor storage apparatus according to claim 2, wherein first data line selection transistors are connected between the first dummy data lines and a charge power supply node, second data line selection transistors are connected between the second dummy data lines and a charge power supply node, the first and second data line selection transistors are driven by a third decode signal, and the first and second data line selection transistors are selectively driven at a same timing as the normal column selection transistors and the reference column selection transistors.

4. A semiconductor storage apparatus according to claim 1, wherein charge speeds in the course of charge of the normal data lines, the reference data lines, the first dummy data lines and the second dummy data lines are substantially equal to each other.

5. A semiconductor storage apparatus according to claim 1, wherein initial values of potentials set, in the data read mode, to the normal data lines, the reference data lines, the first dummy data lines and the second dummy data lines are equal to each other.

6. A semiconductor storage apparatus according to claim 5, wherein the potentials are ground potential.

7. A semiconductor storage apparatus according to claim 1, wherein the cell array comprises a plurality of memory banks, and an access is made to a memory bank to erase or write data to the memory bank during a read operation for another memory bank,
    a current copy circuit copies a reference cell current of a reference cell used as a reference in common in the plurality of memory banks to each of the memory banks,
    a plurality of mirror transistor circuits are provided corresponding to the plurality of memory banks, each of the plurality of mirror transistor circuits comprising a plurality of mirror transistors connected to a plurality of reference bit lines of a corresponding memory bank and supplying the reference cell current copied by the copy circuit to the plurality of reference bit lines of the corresponding memory bank, and a distance of a wiring extending from the sense amplifier to the plurality of mirror transistors of each of the plurality of mirror transistor circuits is substantially equal to that of a wiring extending from the sense amplifier to the plurality of memory cells of each of the plurality of memory banks, to make charge speeds in the course of charge of the normal data lines and the reference data lines substantially equal to each other.

8. A semiconductor storage apparatus according to claim 7, wherein each of the mirror transistor circuits further comprises a plurality of selection transistors for selecting the mirror transistors of the mirror transistor circuit, the selection transistors being driven by a fourth decode signal.

9. A semiconductor storage apparatus according to claim 8, wherein the fourth decode signal is generated at a same timing as a word line decode signal for driving word lines.

10. A semiconductor storage apparatus according to claim 8, wherein the fourth decode signal is generated at a same timing as the second decode signal for driving the plurality of reference column selection transistors.

11. A semiconductor storage apparatus according to claim 7, further comprising a bias wiring which apply a bias voltage for copying the reference current from the current copy circuit to the mirror transistor circuit of each of the memory banks.

12. A semiconductor storage apparatus according to claim 11, further comprising a shield wiring provided along both sides of the bias wiring, and connected to a fixed potential.

13. A semiconductor storage apparatus according to claim 12, wherein the fixed potential is ground potential.

14. A semiconductor storage apparatus according to claim 1, wherein the cell array comprises a plurality of memory banks, and an access is made to a memory bank to erase or write data to the memory bank during a read operation for another memory bank, a current copy circuit copies a reference cell current of a reference cell used as a reference in common in the plurality of memory banks to each of the memory banks, a plurality of mirror transistor circuits are provided corresponding to the plurality of memory banks, each of the plurality of mirror transistor circuits comprising a plurality of mirror transistors connected to a plurality of reference bit lines of a corresponding memory bank and supplying the reference cell current copied by the copy circuit to the plurality of reference bit lines of the corresponding memory bank, and a distance of a wiring extending from the sense amplifier to the normal data line charging circuit is substantially equal to that of a wiring extending from the sense amplifier to the plurality of memory cells of each of the plurality of memory banks, to make charge speeds in the course of charge of the normal data lines and the reference data lines substantially equal to each other.

15. A semiconductor storage apparatus according to claim 14, wherein each of the mirror transistor circuits further comprises a plurality of selection transistors for selecting the mirror transistors of the mirror transistor circuit, the selection transistors being driven by a fourth decode signal.

16. A semiconductor storage apparatus according to claim 15, wherein the fourth decode signal is generated at a same timing as a word line decode signal for driving word lines.

17. A semiconductor storage apparatus according to claim 15, wherein the fourth decode signal is generated at a same timing as the second decode signal for driving the plurality of reference column selection transistors.

18. A semiconductor storage apparatus according to claim 14, further comprising a bias wiring which apply a bias voltage for copying the reference current from the current copy circuit to the mirror transistor circuit of each of the memory banks.

19. A semiconductor storage apparatus according to claim 18, further comprising a shield wiring provided along both sides of the bias wiring, and connected to a fixed potential.

20. A semiconductor storage apparatus according to claim 19, wherein the fixed potential is ground potential.

* * * * *